United States Patent [19]

Shiga

[11] Patent Number: 5,070,376
[45] Date of Patent: Dec. 3, 1991

[54] SEMICONDUCTOR DEVICE

[75] Inventor: Nobuo Shiga, Yokohama, Japan

[73] Assignee: Sumitomo Electric Industries, Ltd., Osaka, Japan

[21] Appl. No.: 631,909

[22] Filed: Dec. 21, 1990

[30] Foreign Application Priority Data

Jan. 5, 1990 [JP] Japan .......................... 2-247
Jan. 5, 1990 [JP] Japan .......................... 2-248
Jan. 5, 1990 [JP] Japan .......................... 2-250
Jan. 5, 1990 [JP] Japan .......................... 2-251

[51] Int. Cl.⁵ .......................................... H01L 29/80
[52] U.S. Cl. ........................................ 357/22; 357/15; 357/68
[58] Field of Search ............................. 357/15, 22, 68

[56] References Cited

U.S. PATENT DOCUMENTS 4,611,184 9/1986 Kumar ........................... 357/22
4,982,247 1/1991 Aoki et al. ..................... 357/22

FOREIGN PATENT DOCUMENTS 0071256 4/1987 Japan ............................. 357/22

Primary Examiner—Edward J. Wojciechowicz
Attorney, Agent, or Firm—Beveridge, DeGrandi & Weilacher

[57] ABSTRACT

A semiconductor device includes an FET having side gate electrodes. The FET has a plurality of side gate electrodes, and the side gate electrodes, side gate input terminals and lead wires connecting them are arranged such that a difference between electrical lengths from the side gate electrodes to the input terminals (pads) is smaller than a quarter wavelength of the input signals thereto. Thus, even if a microwave signal is applied to the side gate input terminals, the signals reach the side gate electrodes with substantially the same phase and the side gate effect extends to the entire gate electrode.

8 Claims, 4 Drawing Sheets

SEMICONDUCTOR DEVICE

BACKGROUND OF THE INVENTION

1. Field of the Invention

The present invention relates to a semiconductor device which includes a Schottky barrier field effect transistor (FET), and more particularly to a semiconductor device which includes a Schottky barrier FET having a side gate electrode.

2. Related Background Art

A Schottky Barrier FET which uses GaAs has been known.

In such a GaAs MESFET, a phenomenon called a side gate effect in which a threshold voltage of the FET varies with a voltage applied to an electrode located in a vicinity of a gate electrode has been known.

Such a side gate effect prevents high density integration of an FET IC (integrated circuit) and it has been a technical problem to suppress the side gate effect.

However, from another view point, it is possible to control the threshold voltage of the FET by the voltage applied to the electrode formed in the vicinity of the gate electrode, and this may be applicable to the realization of various circuit functions.

In general, in a microwave circuit, the circuit design is made by taking a wavelength into consideration because a dimension of the device is not negligible to the wavelength. A gate electrode of a microwave FET is as long as 300 $\mu$m. Thus, even if a side gate electrode is located near an end of the long gate electrode, a sufficient effect is not expected and it is necessary to from another side gate electrode at an intermediate point of the long gate electrode which extends along the gate width in order to attain an effective control.

SUMMARY OF THE INVENTION

It is an object of the present invention to provide a practical semiconductor device which includes an FET having a side gate electrode.

It is another object of the present invention to provide a semiconductor device which is operable in a microwave band, a semiconductor device which can be used as an amplitude modulator, a semiconductor which can be used as a frequency converter and a semiconductor device which can be used as an analog switch.

In order to achieve the above objects, the semiconductor device of the present invention comprises a microwave FET having a plurality of side gate electrodes arranged thereon wherein the side gate electrodes, side gate input terminals and lead wires connecting them are arranged such that the difference between electrical lengths from the side gate electrodes to one associated input terminals is smaller than the quarter of the wavelength of the input signal.

The semiconductor device of the present invention which can be used as an amplitude modulation non-linear device comprises an FET having a side gate electrode formed by an Ohmic contact arranged in a vicinity of a gate electrode on the same semiconductor substrate wherein a signal to be modulated is applied to the gate electrode and a modulation signal is applied to the side electrode.

The semiconductor device of the present invention which can be used as a frequency conversion non-linear device comprises an FET having a side gate electrode formed by an Ohmic contact arranged in the vicinity of a gate electrode on the same semiconductor substrate wherein a signal to be converted is applied to the gate electrode and a local oscillation signal is applied to the side gate electrode.

The semiconductor device of the present invention which can be used as an analog switch FET comprises an FET having a side gate electrode formed by an Ohmic contact arranged in a vicinity of a gate electrode on the same semiconductor substrate wherein a drive signal is applied to the side gate electrode.

The present invention will become more fully understood from the detailed description given hereinbelow and the accompanying drawings which are given by way of illustration only, and thus are not to be considered as limiting the present invention.

Further the scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

One embodiment of the present invention is now explained with reference to FIG. 1.

Figure 1:
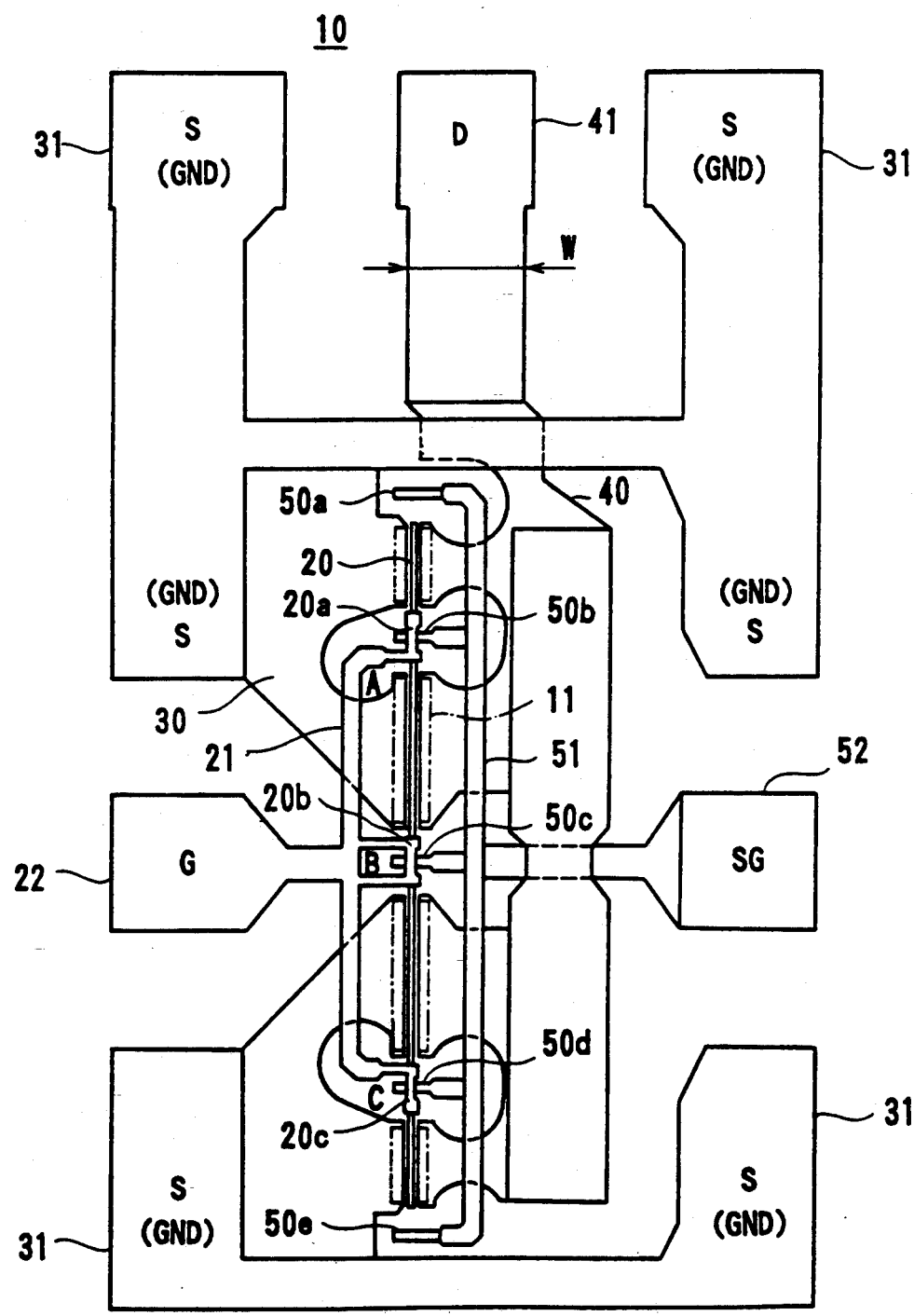
FIG. 1 shows a plan view of a microwave FET having a side gate electrode in accordance with one embodiment of the present invention.

FIG. 1 shows a plan view of a structure of an FET in accordance with the embodiment. It shows only a planar positional relationship of electrodes and wiring patterns, and interlayer insulation films are omitted. A gate electrode 20, a source electrode 30 and a drain electrode 40 are arranged on a GaAs semi-insulative substrate 10. The source electrode 30 and the drain electrode 40 also serve as wiring layers.

In such an FET, it has been known that the smaller a gate resistance is and the smaller the gate capacitance is, the smaller is a noise index. The gate electrode 20 extends along the gate width. For such a long gate electrode, the larger the number of feeding points, the smaller is the gate resistance (theoretically, in reverse proportion to the square of the number of feeding points) but the larger is the gate capacitance. Accordingly, there exists an optimum number of feeding points which minimizes the noise index. The optimum value is, in general, 3 to 7 though it varies with the material and structure of the FET.

In the present embodiment, the gate electrode 20 is connected to a gate input terminal (pad) 22 at three feeding points (A,B,C) through a lead wire 21.

In the present embodiment, side gate electrodes 50a to 50e are arranged to the gate electrode 20 at five points, that is, at the respective feeding points and the opposite ends. Each side gate electrode is made of a metal which ohmically contacts to an n+ region formed in the substrate 10, and it is arranged to the gate electrode 20 to cross the gate width orthogonally. The gate electrode 20 is connected at the crosspoints by upper wiring layers 20a, 20b and 20c formed in an air bridge structure to cross over the side gate electrodes. The air bridge structure is adopted in order to minimize the gate capacitance.

Figure 2:
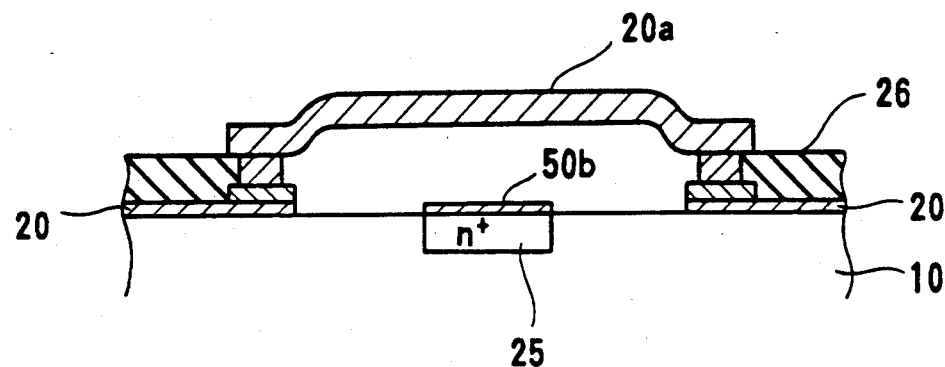
FIG. 2 shows a partial sectional view of the side gate electrode of the microwave FET.

FIG. 2 shows a partial sectional view of the air bridge structure in the upper wiring layer 20a. Numeral 25 denotes an n+ region and numeral 26 denotes an interlayer insulative film.

The gate electrode 20 forms a Schottky contact to an activation layer 11 shown by a chain line in FIG. 1. On the other hand, the source electrode 30 and the drain electrode 40 are formed to ohmically contact to the n regions formed on the opposite sides of the gate electrode 20. Accordingly, those source and drain electrodes are formed by a lower wiring layer and connected to upper layer terminals (pads) 31 and 41 through contact holes. A drain wiring layer at a crosspoint of the lead wire 51 of the side gate electrode 50, and a source wiring layer at a crosspoint of the drain wiring layer are formed by the upper wiring layer.

The terminals (pads) of the gate, drain and side gates are arranged to allow probing by a microwave wafer prober of the cascade microtech Inc. so that the modeling necessary for the circuit design may be readily done by a network analyzer. Microwaves of up to 26.5 GHz may be applied.

A width W of the lead wire to the drain is selected such that a characteristic impedance is equal to 50 ohms (approximately 70 μm when the substrate 10 is made of GaAs having a thickness of 100 μm) in order to facilitate the matching with a measurement system. A source terminal 31 is grounded.

A side gate input terminal 52, the side gate electrodes 50a to 50e and the lead wire 51 connecting them are formed such that a difference between electrical lengths from the side gate electrodes 50a to 50e to the side gate input terminals 52 is sufficiently negligible to the quarter wavelength of the side gate input signal at the operating frequency. In the present embodiment, the side gate electrodes 50a to 50e are arranged symmetrically with respect to a center line which bisects the gate electrode 20 at the center of its width. As for the side gate electrodes 50a and 50e, and the side gate electrodes 50b and 50d, the electrical lengths to the side gate input terminal 52 are equal, respectively. The electrical length is largest for the opposite end side gate electrodes 50a and 50e, and smallest for the center side gate electrode 50c. In the present embodiment, a difference therebetween is less than one tenth (about 200 μm) of the quarter wavelength of the 10 GHz signal.

In this manner, the phase difference caused when the microwave signal applied to the side gate input terminal 52 reaches the side gate electrodes 50a to 50e can be neglected. Accordingly, the microwave may be used as a control signal applied to the side gate electrode 50.

An amplitude modulator which uses an FET having a side gate electrode as a nonlinear device is now explained.

Figure 3:
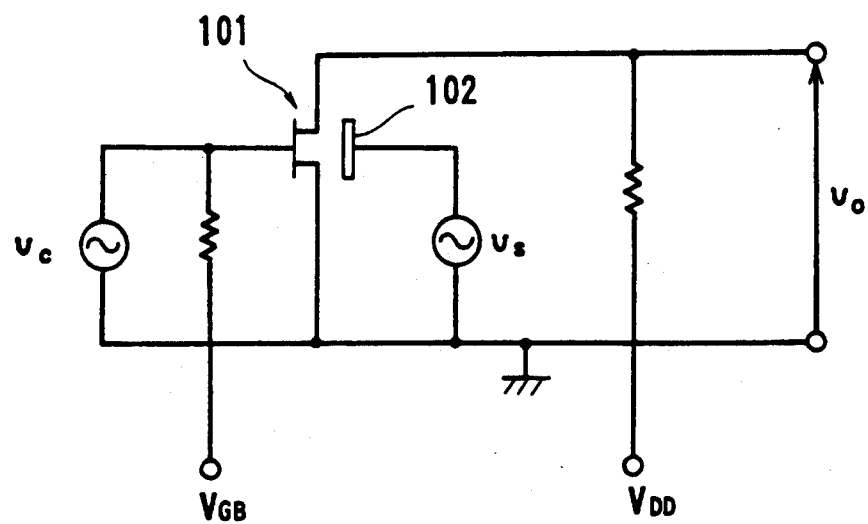
FIG. 3 shows a circuit diagram of an amplitude modulator which uses the FET having the side gate electrode.

FIG. 3 shows a circuit diagram of the amplitude modulator of the present invention. An FET 101 has a side gate electrode 102 as will be explained later, and a signal $v_c$ to be modulated is applied to a gate electrode (gate-source) and a modulation signal $v_s$ is applied to the side gate electrode 102 (side gate-source). $V_{GB}$ denotes a gate bias voltage, and $V_{DD}$ denotes a power supply voltage. The source is grounded.

In this arrangement, a signal which is amplitude-modulated as desired can be derived as drain output voltage $v_o$, as will be explained later. The only non-linear device required is the single FET 101. Further, since the side gate electrode 102 to which the modulation signal is applied is independent from the others, no isolation circuit is required.

In general, an input/output characteristic of the FET is expressed by $$i_d = K(v_{gs} - v_{th})^2 \qquad (1)$$

where $V_{th}$ is a threshold voltage, $v_{gs}$ is a gate-source voltage, $i_d$ is a drain current and K is a constant.

Figure 4:
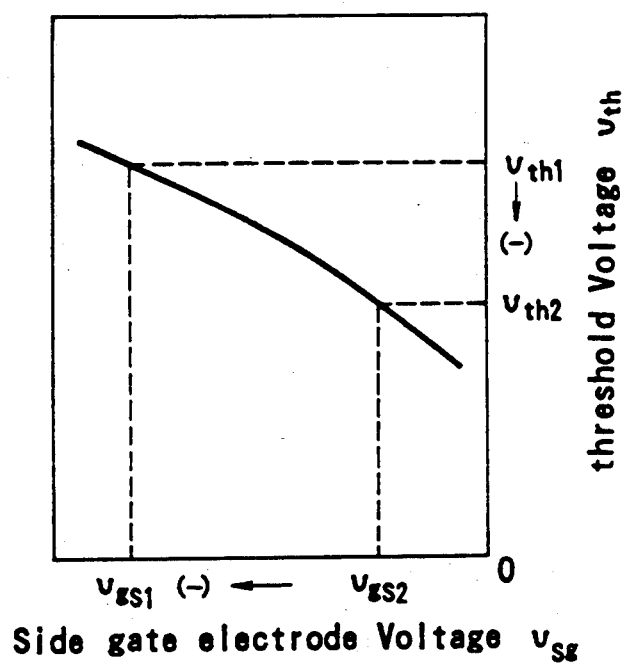
FIG. 4 shows a characteristic chart of a side gate effect.

On the other hand, the threshold voltage of the FET varies with a voltage $v_{sg}$ applied to the electrode (side gate electrode) arranged in the vicinity of the gate electrode, as shown in FIG. 4. The side gate effect may be approximately expressed by $$V_{th} = kv_{sg} \qquad (2)$$

where K is a constant, in a certain limited range of the side gate voltage.

From the formulas (1) and (2), the drain current $i_d$ is given by $$\begin{aligned} i_d &= K(v_{gs} - kv_{sg})^2 \\ &= Kv_{gs}^2 - 2kKv_{gs} \cdot v_{sg} + Kk^2 v_{sg}^2 \end{aligned} \qquad (3)$$

The second term in the formula (3) indicates a product of $v_{gs}$ and $v_{sg}$. Where the signal to be modulated and the modulation signal are used for $v_{gs}$ and $v_{sg}$, the desired signal may be derived from the drain output.

By applying the microwave FET shown in FIG. 1 to the FET 101 of the amplitude modulator, the amplitude modulation in the microwave band can be attained.

A frequency converter (mixer) which uses the FET having the side gate electrode as the non-linear device is now explained.

Figure 5:
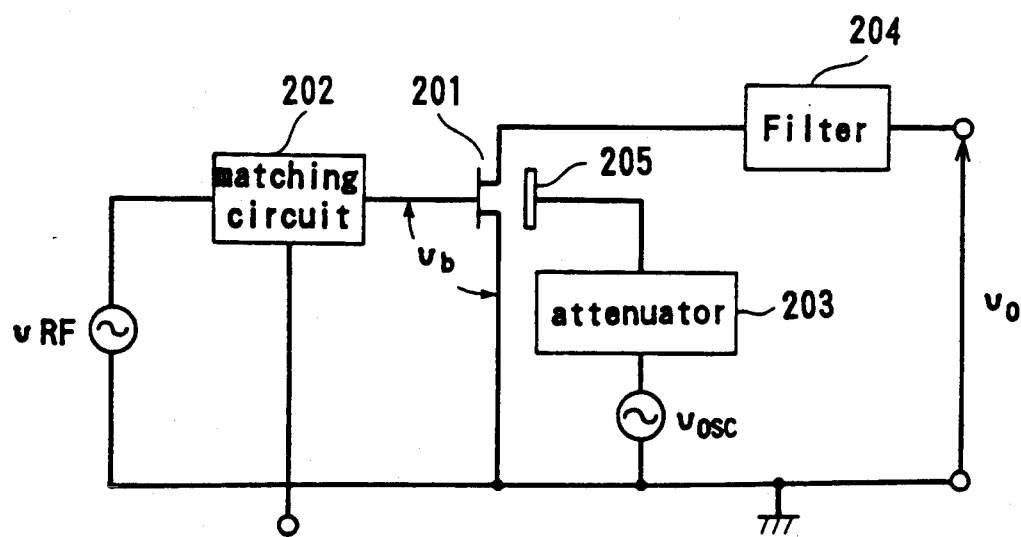
FIG. 5 shows a circuit diagram of a frequency converter which uses the FET having the side gate electrode.

FIG. 5 shows a circuit diagram of the mixer in accordance with the present embodiment. An FET 201 has a side gate electrode 205, and a signal $v_{RF}$ to be converted (frequency $f_{RF}$) is applied to a gate electrode (gate-source) and a local oscillation signal $v_{osc}$ (frequency $f_{osc}$) is applied to the side gate electrode 205 (side gate-source). Numeral 202 denotes a matching circuit. Where the signal $v_{RF}$ to be converted which is applied to the gate electrode of the FET 201 is a very high frequency signal, the input signal is reflected and not supplied to the FET 201 unless the matching with an input impedance of the FET 201 is done. The matching circuit 202 serves for this purpose. An attenuator 203 prevents the local oscillation signal $v_{osc}$ from being reflected back to the local oscillator. The local oscillation signal $v_{osc}$ is of very large power such as 10 dB to cause non-linearity of the FET 201. If such a high power signal is sent back to the local oscillator, the circuit may be broken. Thus, the attenuator 203 of −3 dB, for example, is inserted so that the signal is attenuated by −6 dB in total back and forth. This corresponds to 3 in the VSWR (voltage standing wave ratio) and it is very close to 50Ω as viewed from the oscillator.

A filter 204 serves to extract only the frequency-converted signal from the drain output of the FET 201. Where the mixer of the present embodiment is used as a down converter, a low-pass filter is used as the filter 204. The source of the FET 201 is grounded.

The threshold voltage $V_{th}$ varies with the voltage $V_{sg}$ applied to the side gate electrode 205 as shown in FIG. 4. Assuming that a range of the change of the threshold voltage of the FET 201 due to the application of the local oscillation signal $v_{osc}$ to the side gate electrode 205 is $V_{th1}$ to $V_{th2}$, a bias voltage $v_b$ between the gate and the source is set to approximately $(v_{th1}+v_{th2})/2$. Thus, when $v_b < v_{th}$ as $v_{th}$ changes by the level of $v_{osc}$, the FET 201 is cut off, and when $v_b > v_{th}$, the FET 201 conducts.

Thus, the drain current of the FET 201 is turned on and off by the local oscillation signal $v_{osc}$ so that the mixing is attained. Since the side gate electrode 205 to which the local oscillation signal $v_{osc}$ is applied is independent from others, no isolation circuit is required.

By applying the microwave FET of FIG. 1 to the FET 201 of the frequency converter, the frequency conversion in the microwave band is attained.

An analog switch which uses the FET having the side gate electrode is now explained.

Figure 6:
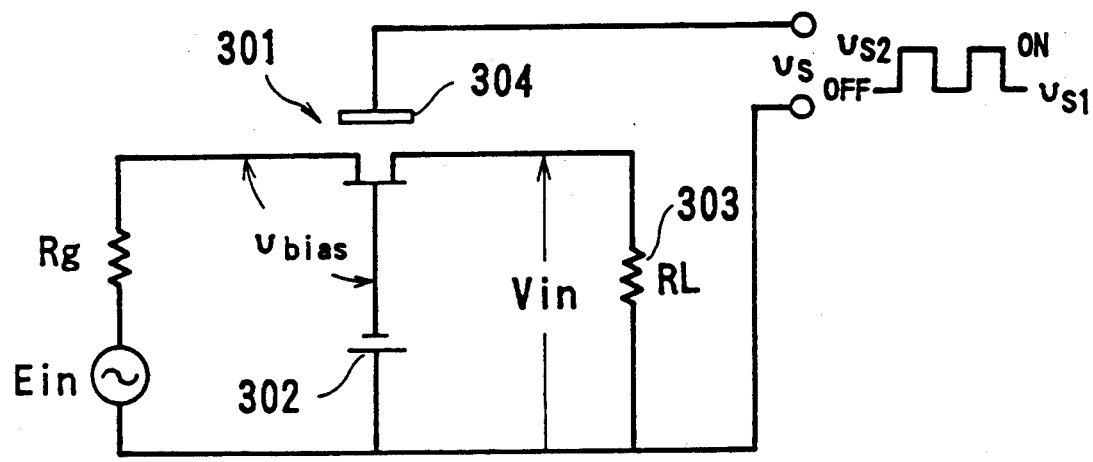
FIG. 6 shows a circuit diagram of an analog switch which uses the FET having the side gate electrode

FIG. 6 shows a circuit diagram thereof. An FET 301 has a side gate electrode 304 to which a sampling pulse voltage $v_s$ is applied as a drive signal. Amplitudes $v_{s1}$ to $v_{s2}$ of the sampling pulse voltage correspond to the side gate voltage $v_{sg1}$ to $v_{sg2}$ of FIG. 4. The threshold voltage of the FET 301 varies between $v_{th1}$ and $v_{th2}$. A bias voltage 302 is applied to maintain a bias voltage $v_{bias}$ between the gate and the source as $v_{th2} < v_{bias} < v_{th1}$.

Thus, when the sampling pulse voltage is $v_{s1}$ (=$v_{sg1}$), $v_{bias} < v_{th}$ is met and the FET 301 is cut off so that the output to a load (resistor $R_L$) 303 is zero irrespective of the input signal $E_{in}$. On the other hand, when the sampling pulse voltage is $v_{s2}$ (=$v_{sg2}$), $v_{bias} > v_{th}$ is met and the FET 301 conducts so that the sampling signal $v_{in}$ is produced at the load 303. Accordingly, the FET 301 functions to block the input signal at one time and pass it to the load at the other time depending on the level of the sampling pulse voltage.

By applying the microwave FET of FIG. 1 to the FET 301 of the analog gate, switching in the microwave band is attained.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor device having a FET which is controllable by a microwave control signal, said FET comprising:
   a semiconductor substrate;
   a source region formed on said substrate;
   a drain region formed on said substrate;
   a gate region provided between said source and drain regions;
   a gate electrode formed on said gate region, said gate electrode comprising a Shottky metal and having a plurality of feed points;
   a control input terminal to which a microwave control signal can be applied;
   electrical lead wires; and
   a plurality of control electrodes connected to said control input terminal by said lead wires, said control electrodes comprising Ohmic metal, each control electrode being electrically coupled to said gate region under a portion of said gate electrode, said control electrodes each extending outwardly from said gate region, said electrical lead wires having lengths from said control electrodes to said control input terminal such that a difference in the lengths of two of said lead wires is shorter than one quarter of the wavelength of a control signal applied to said control input terminal.

2. A semiconductor device according to claim 1 wherein said difference is less than one tenth of one quarter of the wavelength of said control signal.

3. A semiconductor device according to claim 2 wherein two of said control electrodes are formed in the vicinities of opposite ends of said gate electrode on said semiconductor substrate, and the difference in said lengths of lead wires from said two control electrodes and other control electrodes to said control input terminal are shorter than one quarter of the wavelength of said control signal.

4. A semiconductor device according to claim 3 wherein said control electrodes are arranged symmetrically with respect to a line crossing through the center of said gate electrode along the gate length direction.

5. A semiconductor device according to claim 1 wherein said gate electrode provides an input electrode for a signal to be modulated and said control electrodes provide input electrodes for a modulating signal whereby said microwave FET provides an amplitude modulation non-linear device.

6. A semiconductor device according to claim 1 wherein said gate electrode provides an input electrode for a signal to be converted and said control electrodes provide input electrodes for a local oscillation signal whereby said microwave FET provides a frequency conversion non-linear device.

7. A semiconductor device according to claim 6 wherein an impedance matching circuit is provided between said gate electrode and a source for the signal to be converted, and an attenuator is provided between said control electrodes and a source for the local oscillation signal.

8. A semiconductor device according to claim 1 wherein a constant voltage is applied to said gate electrode and a drive signal is applied to said control electrodes to control turn-on and turn-off of drain current whereby said microwave FET provides an analog switch.

* * * * *